(12) United States Patent
Bahramian

(10) Patent No.: US 7,948,220 B2
(45) Date of Patent: May 24, 2011

(54) METHOD AND APPARATUS TO REDUCE DYNAMIC RDSON IN A POWER SWITCHING CIRCUIT HAVING A III-NITRIDE DEVICE

(75) Inventor: HamidTony Bahramian, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 378 days.

(21) Appl. No.: 12/099,883

(22) Filed: Apr. 9, 2008

(65) Prior Publication Data

US 2008/0253151 A1 Oct. 16, 2008

Related U.S. Application Data

(60) Provisional application No. 60/911,147, filed on Apr. 11, 2007.

(51) Int. Cl.
*G05F 1/613* (2006.01)
*G05F 1/00* (2006.01)

(52) U.S. Cl. .................................. 323/224; 323/289

(58) Field of Classification Search .............. 323/224, 323/289, 283
See application file for complete search history.

(56) References Cited

U.S. PATENT DOCUMENTS

| 7,012,468 | B2 | 3/2006 | Brederlow et al. | |
|---|---|---|---|---|
| 7,298,123 | B2 * | 11/2007 | Watanabe et al. | 323/282 |
| 7,504,690 | B2 * | 3/2009 | Kelly et al. | 257/328 |
| 2006/0113971 | A1 * | 6/2006 | Watanabe et al. | 323/265 |
| 2008/0013690 | A1 * | 1/2008 | Lurz et al. | 378/167 |

* cited by examiner

*Primary Examiner* — Shawn Riley
(74) *Attorney, Agent, or Firm* — Farjami & Farjami LLP

(57) ABSTRACT

A method of preventing the Rdson of a III-V Nitride power switching circuit from varying over time. The method includes biasing the switch to a pre-bias voltage level just below turn ON when the switch is OFF, wherein traps are discharged when the switch is biased to the pre-bias voltage level just below turn ON and the varying of the Rdson over time due to traps is reduced. The method can be employed in DC-DC converter circuits having III-V Nitride control and synchronous switches connected at a switching node.

22 Claims, 2 Drawing Sheets

Generalized detraping scheme

Normal gate drive scheme

Gate drive scheme with pre-bias

De-trapping gate drive scheme

Variation of the scheme

METHOD AND APPARATUS TO REDUCE DYNAMIC RDSON IN A POWER SWITCHING CIRCUIT HAVING A III-NITRIDE DEVICE

CROSS-REFERENCE TO RELATED APPLICATION

This application is based on and claims priority to U.S. Provisional Patent Application Ser. No. 60/911,147, filed on Apr. 11, 2007 and entitled METHOD TO REDUCE DYNAMIC Rdson IN DC-DC CONVERTER HAVING A THREE-FIVE NITRIDE DEVICE, the entire contents of which is hereby incorporated by reference.

BACKGROUND OF THE INVENTION

The present invention relates to III-V Nitride devices and DC-DC converters using such switches, and more particularly to reducing short term trapping in III-V Nitride switching devices to prevent dynamic Rdson.

Due to their high breakdown voltage characteristics and higher electron mobility than Silicon, III-V Nitride devices have a great potential to be used in power management solutions. These devices can be used, for example, in DC-DC converter applications and are advantageous due to their lower Rdson and lower charge characteristics. However, there are issues related to trapping, which may lower the performance of these devices. One such problem is the short term trapping phenomenon, where the III-V Nitride device's Rdson may temporarily increase due to traps. What is needed is a technique that can reduce III-V Nitride device's problems related to short term trapping.

SUMMARY OF THE INVENTION

It is an object of the present invention to provide a way to prevent the Rdson of a switching III-V Nitride power switch from increasing, i.e., "dynamic Rdson" due to the trapping phenomenon exhibited when such a power switch, e.g., a III-V Nitride Field-Effect Transistor (FET), is switched from being completely OFF to being completely ON.

Provided is a method of preventing the Rdson of III-V Nitride power switches of a switching circuit from varying over time. The method includes a step of biasing the switch to a pre-bias voltage level just below turn ON when the switch is OFF, wherein traps are discharged when the switch is biased to the pre-bias voltage level just below turn ON and the varying of the Rdson over time due to traps is reduced. The present invention can be used, e.g., in converter circuits, such converter circuits include a gate driver for controlling control and synchronous switches connected at a switching node.

Other features and advantages of the present invention will become apparent from the following description of the invention that refers to the accompanying drawings.

DETAILED DESCRIPTION OF EMBODIMENTS OF THE INVENTION

Figure 1:
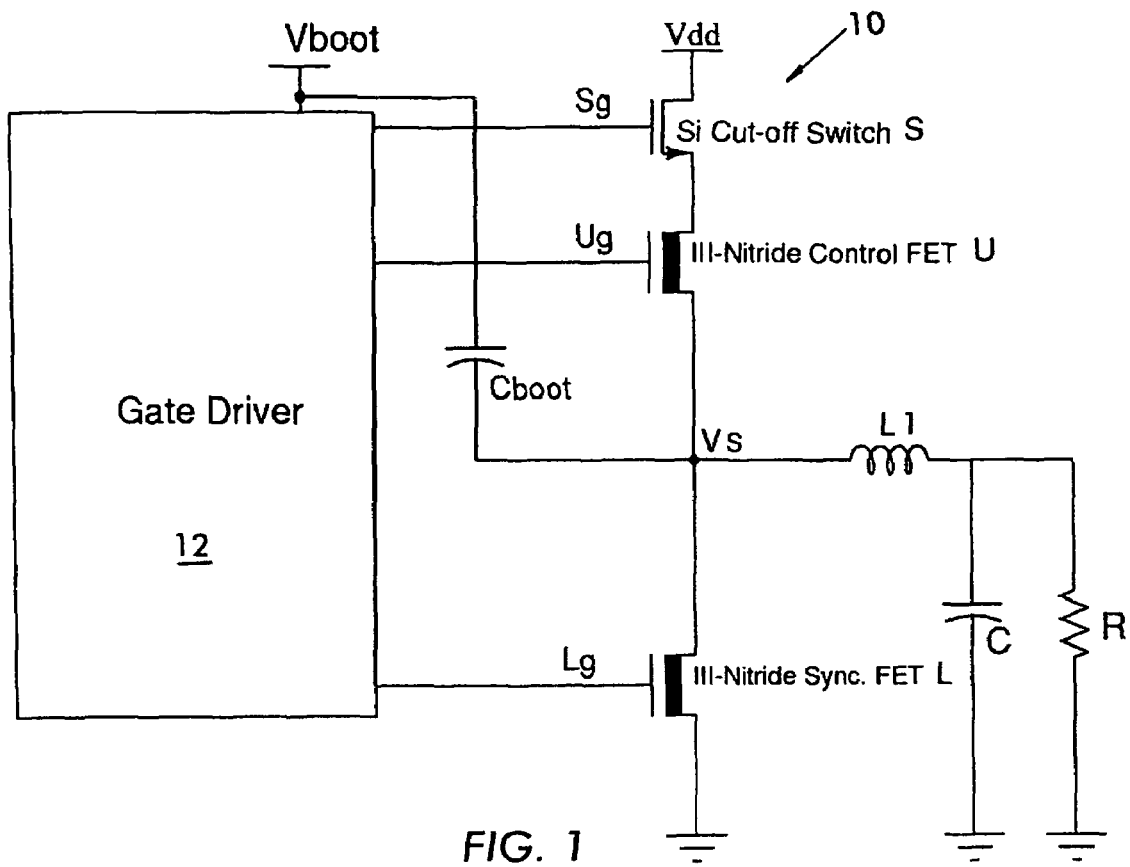
FIG. 1 is a DC-DC half bridge buck converter circuit using three-five nitride depletion devices.

FIG. 1 illustrates a DC-DC half bridge converter circuit 10 including a gate driver 12 for controlling, by providing proper drive signals to, a control FET U having a gate terminal Ug and a synchronous FET L having a gate terminal Lg. In the illustrated configuration both the synchronous FET L and the control FET U are III-V Nitride power devices connected at a switching node, for example, GaN devices. The gate driver 12 also controls a silicon cut-off switch S having a gate terminal Sg that is positioned between a power source Vdd and the control FET U, whose operation will be explained below.

The circuit 10 further includes a bootstrap capacitor Cboot connected between a terminal Vboot (providing the high side driver power source) of the gate driver 12 and the switching node, an output inductor L1 connected between the switching node $V_S$ and an output capacitor C connected across the load R.

Before system start-up, the silicon enhancement mode "cut-off" switch S is used to turn OFF the current for depletion mode III-V Nitride devices U and S from the power source Vdd. During normal operation, the gate driver 12 controls the gate terminal Ug to turn the control FET U completely ON or completely OFF. In GaN devices a higher Rdson of the control FET is observed when it is switched from being completely OFF to being completely ON. Trapping phenomenon may exhibit itself when the control FET is turned from completely OFF to ON. A higher Rdson may be observed in the beginning of the cycle, which then reduces over time (e.g. nanoseconds or microseconds). The temporary increase in Rdson may be termed "dynamic Rdson".

In a III-V Nitride, e.g., GaN device, DC-DC converter circuit 10, the control FET U may exhibit "dynamic Rdson," where the Rdson is varied over time due to traps in the III-V Nitride device. According to the invention, if the control FET is biased to just below turn ON, the traps will discharge and hence reduce the "dynamic Rdson" issue.

Figure 2A:
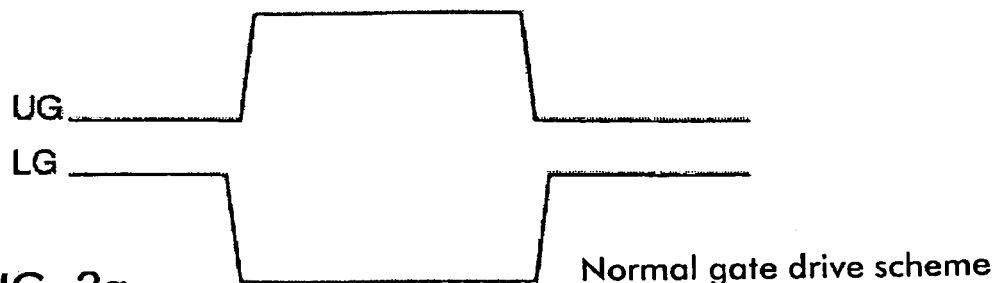
FIG. 2a is a graph showing a prior art gate drive scheme for driving high- and low-side switches of a half bridge in a converter circuit.
Figure 2B:
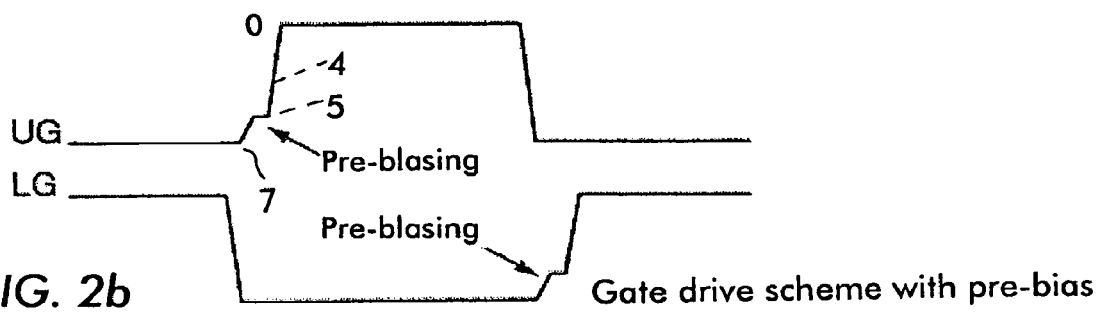

To reduce "dynamic Rdson", a new gate drive scheme, one example of which is illustrated in FIG. 2b, can be applied to the gate terminals Ug and Lg of the control and synchronous PETs U and L. This scheme consists of a "pre-bias" voltage, which de-traps the electrons in III-V Nitride devices, e.g., GaN FET, hence reducing the "dynamic Rdson".

The level of pre-bias is chosen such that the device is set to just below the threshold voltage, hence there is no significant current conduction. For example, the gate terminals of the power devices may be switched from −7V to 0V for a threshold voltage of −4V. The pre-bias voltage is set at −5V, i.e., the power device does not conduct significant current, while the electron trapping is reduced by the application of −5V.

Figure 3A:
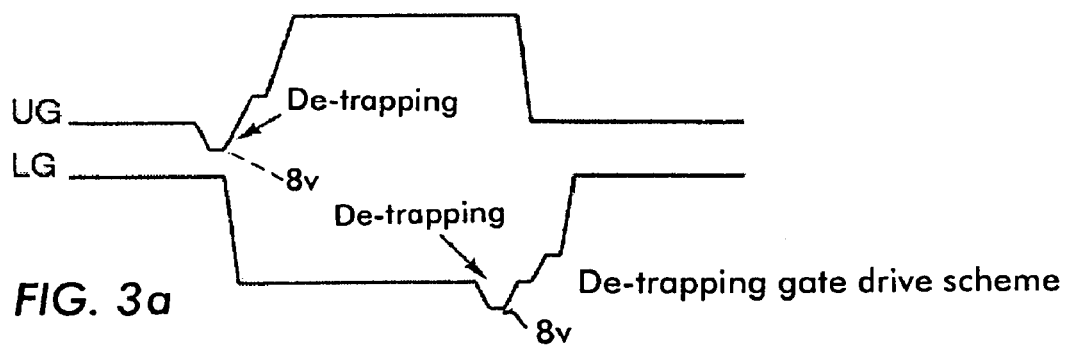
Figure 3B:
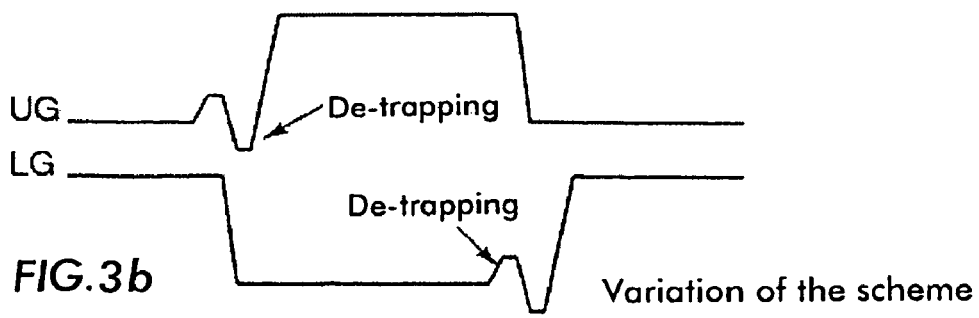

Depending on the type and depth of traps, the "de-trapping bias" can be tailored such that it reduces traps in the III-Nitride power device. Other gate drive schemes are illustrated in FIGS. 3a and 3b, where various positive or negative biases are applied to the gate terminals Ug or Lg before turn ON, in order to reduce trapping and enhance the performance of the power device. For example, a "de-trap" bias of −8V may be used for short duration.

Figure 4:
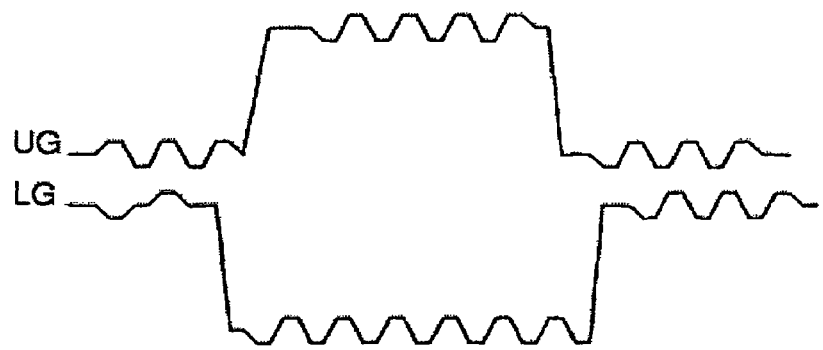
FIGS. 2b, 3a, 3b, and 4 are graphs showing gate drive schemes to reduce "dynamic Rdson" in high- and low-side switches of the half bridge of the converter circuit in accordance with the present invention.

FIG. 4 illustrates a generalized de-trapping gate drive scheme, in which the de-trapping bias is applied to the gate terminals Ug or Lg during both ON time and OFF time, depending on the type of traps encountered. The voltage level and frequency of "de-trap" bias can be chosen properly in order to reduce traps, while not to interfere with the normal operation of the converter. The timing of the de-trap bias also does not interfere with dead-time control of the converter, since it is selected to be shorter than the main switching cycle.

Another method to "de-trap" in the III-V Nitride device is to apply a "de-trapping" bias to the gate terminal Ug of the control FET U, while the synchronous FET L is ON and the cut-off switch S is OFF. A bias may be applied to the gate terminal Ug to turn on the control FET U and prepare it for the real turn ON. Since the gate terminal Sg is OFF, the gate terminal Ug bias can be completely turned ON, without any current conduction in the control FET U. In this fashion, the GaN control FET U has enough time to be de-trapped and hence no adverse dynamic Rdson increase is observed.

While depletion mode III-V Nitride devices have been described in the present specification, the same techniques may be applied to enhancement mode III-Nitride devices as well.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of preventing the Rdson of a III-V Nitride power switch in a power switching circuit from varying over time, the method comprising biasing the power switch to a pre-bias voltage level just below turn ON when the switch is OFF, wherein traps are discharged when the switch is biased to the pre-bias voltage level just below turn ON and the varying of the Rdson over time due to traps is reduced.

2. The method of claim 1, wherein the power switching circuit is a DC-DC converter circuit, the converter circuit including a gate driver for controlling control and synchronous power switches connected at a switching node.

3. The method of claim 1, further comprising a step of selecting the voltage level of bias so as to set the switch being biased to just below a turn-on threshold voltage without creating a significant current conduction.

4. The method of claim 2, wherein the voltage level of bias depends on a type and depth of the traps.

5. The method of claim 3, further comprising a step of applying the voltage level of bias for reducing traps to the switches during ON- and OFF-times.

6. The method of claim 2, wherein the selected voltage level of the bias and a frequency of biasing does not interfere with a normal operation of the converter circuit.

7. The method of claim 6, further comprising a step of selecting a timing of the biasing to be shorter than a main switching cycle of the switches so as not to interfere with a dead-time control of the converter circuit.

8. The circuit of claim 2, wherein the converter circuit further includes a cut-off switch controlled by the gate driver and connected between the control switch and a power supply, the cut-off switch turning OFF current flowing from the power supply to the control switch before a start-up of the circuit.

9. The method of claim 8, further comprising a step of biasing the control switch while the synchronous switch is ON and the cut-off switch is OFF to turn ON the control switch to prepare it for the cut-off switch being turned ON.

10. The method of claim 1, further comprising a step of providing a de-trapping bias either before or after the pre-bias voltage lead.

11. The method of claim 1, further comprising alternately providing the pre-bias voltage level and the de-trapping voltage level during either or both the on time and off time of the power switch.

12. The method of claim 2, wherein the pre-bias voltage level is applied to either or both the control switch or the synchronous switch.

13. A DC-DC converter circuit for reducing dynamic Rdson of at least one of a control and synchronous III-V Nitride power switch connected at a switching node and having gate terminals, the switches being controlled by a gate driver, wherein during a normal operation of the converter circuit after the at least one switch is controlled completely OFF the gate of the OFF switch is biased to a voltage level just below turn ON to prevent a dynamic Rdson of the switch by discharging traps.

14. The circuit of claim 13, wherein the dynamic Rdson is a state in which the Rdson varies over time due to traps.

15. The circuit of claim 13, wherein the voltage level of the bias is selected such that the switch is set to just below a threshold voltage and does not create significant current conduction.

16. The circuit of claim 15, wherein the voltage level of the bias is tailored to reduce traps in a III-V Nitride switch depending on a type and depth of the traps.

17. The circuit of claim 16, wherein the voltage level of the bias is applied to the gate of the switch during both ON- and OFF-times.

18. The circuit of claim 16, wherein the voltage level and frequency of the bias application is selected to reduce traps without interfering with a normal operation of the converter circuit.

19. The circuit of claim 18, wherein a timing of the bias application for reducing traps is selected to be shorter than a main switching cycle so as not to interfere with a dead-time control of the converter circuit.

20. The circuit of claim 13, further comprises a cut-off switch having a gate terminal and being controllable by the gate driver, the cut-off switch is connected between the control switch and a power supply, the cut-off switch turning OFF current flowing from the power supply to the control switch before a start-up of the circuit.

21. The circuit of claim 20, wherein the cut-off switch is a silicon device and the control and synchronous switches are Field-Effect Transistor (FET) device.

22. The circuit of claim 20, wherein the voltage level of the bias is applied to the gate of the control switch while the synchronous switch is ON and the cut-off switch is OFF, the applied voltage level of the bias turning ON the control switch to prepare it for the cut-off switch being turned ON.

* * * * *

UNITED STATES PATENT AND TRADEMARK OFFICE
CERTIFICATE OF CORRECTION

| | |
|---|---|
| PATENT NO. | : 7,948,220 B2 |
| APPLICATION NO. | : 12/099883 |
| DATED | : May 24, 2011 |
| INVENTOR(S) | : Bahramian |

It is certified that error appears in the above-identified patent and that said Letters Patent is hereby corrected as shown below:

In the claims, column 4, line 50, "device" should be changed to --devices--.

Signed and Sealed this
Twenty-ninth Day of November, 2011

David J. Kappos
*Director of the United States Patent and Trademark Office*